United States Patent [19]
Watanabe et al.

[11] Patent Number: 6,153,509
[45] Date of Patent: Nov. 28, 2000

[54] METHOD OF MANUFACTURING A SEMICONDUCTOR DEVICE

[75] Inventors: Kei Watanabe, Tokyo; Yukio Nishiyama, Yokohama; Naruhiko Kaji, Yokohama; Hideshi Miyajima, Yokohama, all of Japan

[73] Assignee: Kabushiki Kaisha Toshiba, Kawasaki, Japan

[21] Appl. No.: 09/343,699

[22] Filed: Jun. 30, 1999

[30] Foreign Application Priority Data

Jul. 1, 1998 [JP] Japan .................................. 10-201195

[51] Int. Cl.[7] .......................... H01L 21/38; H01L 21/44; H01L 21/322
[52] U.S. Cl. ......................... 438/622; 438/597; 438/618; 438/624; 438/474; 438/963; 438/781
[58] Field of Search .................................. 438/622, 624, 438/631, 645, 697, 699, 706, 713, 475, 477, 474, 781, 798, 963, 618, 597, 518, 623, 633, 427; 427/533, 535, 539, 574

[56] References Cited

U.S. PATENT DOCUMENTS

| | | | |
|---|---|---|---|
| 5,800,877 | 9/1998 | Maeda et al. | 427/535 |
| 5,858,869 | 1/1999 | Chen et al. | 438/622 |
| 5,920,791 | 7/1999 | Yang et al. | 438/622 |
| 5,930,655 | 7/1999 | Cooney, III et al. | 438/474 |

*Primary Examiner*—Matthew Smith
*Assistant Examiner*—Igwe U. Anya
*Attorney, Agent, or Firm*—Finnegan, Henderson, Farabow, Garrett, & Dunner, L.L.P.

[57] ABSTRACT

In a method of manufacturing a semiconductor device including a semiconductor element formed on a semiconductor substrate, an SiOF film is formed at least on the top surfaces of metal wirings under condition that an in-chamber pressure is 5 mTorr or lower. The SiOF film can thus be buried into a space between the metal wirings without causing any void and the capacitance between the wirings can be prevented from increasing, while preventing the metal wirings from being damaged and preventing the aspect ratio from increasing.

5 Claims, 5 Drawing Sheets

METHOD OF MANUFACTURING A SEMICONDUCTOR DEVICE

BACKGROUND OF THE INVENTION

The present invention relates to a method of manufacturing a semiconductor device and, more specifically, to a technique of forming an insulation film, such as a fluorine-added silicon oxide (SiOF) film and a fluorine-added nitrified silicon oxide (SiONF) film, on a semiconductor substrate by plasma CVD (chemical vapor deposition).

In conventional semiconductor devices, an $SiO_2$ film is used as an insulation film for electrically isolating elements and wirings. The $SiO_2$ film is formed chiefly by reduced-pressure CVD or atmospheric-pressure CVD using gas such as $SiH_4$ and tetraethoxysilane (TEOS) as a raw stock. In particular, plasma CVD using crude gas such as TEOS and $O_2$ is employed a lot to form an $SiO_2$ film (TEOS film) since it can be formed at low temperature of about 400° C. Since, in the CVD, high-purity crude gas is used as a reaction source more frequently than in another thin-film forming method, a high-quality film can be obtained.

Concerns about a delay in signal transmission have recently been rising in semiconductor devices. This is because a capacitance between wirings is increased by narrowing an interval between them due to miniaturization of elements. The delay in signal transmission is one factor in preventing an improvement in the performance (e.g., operation speed) of a semiconductor device. It is thus necessary to make the dielectric constant of an insulation film formed between the wirings as low as possible.

In semiconductor devices, it is required that a disconnection of wirings be prevented and a focus margin be improved. It is thus necessary to fill a space between high-density wirings without any void and to lessen a level difference between the surfaces thereof.

For the above reason, the development of a method of forming an insulation film capable of mitigating a level difference is demanded in manufacturing of semiconductor devices.

Recently, an SiOF film has been known as an insulation film capable of decreasing in dielectric constant; however, it has a problem of hygroscopicity. It has conventionally been reported that the SiOF film decreases in dielectric constant and increases in hygroscopicity as fluorine increases in concentration. The increase in hygroscopicity makes the dielectric constant high, causes corrosion of metal wiring due to liberation of hydrogen fluoride (HF), causes the film to come off, and decreases in reliability.

The relative dielectric constant ∈ of silicon oxide is 4.1 and decreases to 3.4 as the fluorine concentration (10 to 11 atom %) of the SiOF film increases. If the relative dielectric constant ∈ decreases further, the silicon oxide becomes useful in lessening a delay in signal transmission. The further decrease in relative dielectric constant ∈ heightens the fluorine concentration of the SiOF film, and the high fluorine concentration increases the hygroscopicity of the SiOF film, resulting in deterioration of characteristics of a semiconductor device. The lowest limit of the relative dielectric constant ∈ is therefore 3.4.

It is understood that the hygroscopicity of an SiOF film is increased by the remaining amount of impurities therein, especially hydrogen (H). To use the SiOF film as an insulation film, the hydrogen impurities remaining therein should be reduced as much as possible.

A technique of forming an SiOF film using HDP (high density plasma)-CVD whose plasma density is $10^{10}/cm^3$ or higher, is now under development. For example, a technique using an HDP source of ECR (electron cyclotron resonance) is reported and so is a technique using an HDP source such as an ICP (inductively coupled plasma) coil and helicon. Since, in the HDP-CVD, the resolution of crude gas is increased, the amount of hydrogen impurities contained in the SiOF film is smaller than that in an SiOF film formed by the conventional parallel-plate CVD; accordingly, the SiOF film is prevented from increasing in hygroscopicity.

FIG. 1 schematically shows the constitution of a prior art semiconductor device. In this device, an interlayer insulation film of low dielectric constant such as an SiOF film is buried into a space between two wirings.

As shown in FIG. 1, element isolation regions 102 each having an STI (shallow trench isolation) structure are selectively formed in a P-type silicon semiconductor substrate 100. An NMOS transistor is formed in each of element regions of the semiconductor substrate 100 which are delimited by the element isolation regions 102.

The NMOS transistor includes source and drain regions 104 and 104 formed in a surface area of the semiconductor substrate 100, a gate oxide film 106 formed on the surface of the substrate 100, and a gate electrode 108 formed on the gate oxide film 106 and between the source and drain regions 104 and 104.

An interlayer insulation film 110 of a BPSG (boron-doped phospho-silicate glass) film is formed on the semiconductor substrate 100 so as to coat the respective NMOS transistors. The film 110 includes a contact plug 112 which contacts one of the source and drain regions 104 and 104.

The surface of the interlayer insulation film 110 is flattened by CMP (chemical mechanical polishing), and a plurality of first metal wirings 114 each having a given pattern are formed thereon. Each of the first metal wirings 114 is constituted of an aluminum (Al) film 114a, and barrier metal layers 114b and 114c of Ti/TiN between which the film 114a is interposed. The surface of the interlayer insulation film 110, including the periphery of each metal wiring 114, is covered with a wiring protection film 116 having a uniform thickness and constituted of silicon oxide ($SiO_2$).

A low-dielectric-constant interlayer insulation film 118 of an SiOF film is formed so as to coat the wiring protection film 116. The film 118 includes a contact plug 120 which passes through the wiring protection film 116 and contacts one of the first metal wirings 114.

The surface of the interlayer insulation film 118 is flattened by CMP and a plurality of second metal wirings 122 each having a predetermined pattern are formed thereon. Like the first metal wirings 114, the second metal wirings 122 are each constituted of an Al film 122a and barrier metal layers 122b and 122c of Ti/TiN between which the Al film 122a is interposed. The surface of the interlayer insulation film 118, including the periphery of each metal wiring 122, is covered with a wiring protection film 124 having a uniform thickness and constituted of silicon oxide ($SiO_2$).

A low-dielectric-constant interlayer insulation film 126 of an SiOF film is formed so as to coat the wiring protection film 124.

In order to protect the semiconductor device, three or more metal wirings can be formed on the SiOF film 126, or a surface protecting insulation film (e.g., a passivation film) can be formed in place of the SiOF film 126. If the surface protecting insulation film is formed, the above wiring protection film 124 is not needed.

If an SiOF film is formed directly on a metal wiring by HDP-CVD, a corner portion of the metal wiring is damaged by sputtering damage to the metal wiring and reaction of fluorine (F) radical at the beginning of film formation. To resolve this problem, conventionally, all wirings are covered with a wiring protection film ($SiO_2$ film) having a thickness of several tens of nanometers by the parallel-plate CVD.

If, however, the wirings are covered with the wiring protection film, the aspect ratio increases when the SiOF film is formed and thus the wiring-to-wiring burying characteristics deteriorate.

FIG. 2 is an enlarged view of the major part of the semiconductor device shown in FIG. 1. If a distance D between adjacent metal wirings 114 and 114 is decreased in accordance with higher-degree of integration of the semiconductor device, a wiring-to-wiring aspect ratio A (=H/D:H is a height of the metal wiring 114 or a distance from the bottom to the top of the metal wiring 114 or a thickness of the metal wiring 114). There is a problem in which a void 128 is easy to form when the low-dielectric-constant interlayer insulation film 118 is formed since the aspect ratio A is increased further by forming the wiring protection film 116.

If the wiring protection film 116 is formed, a distance between adjacent wirings, which is indicated by D', becomes shorter than the distance D by 2Y (Y=the thickness of film 116), and the height of the wiring, which is indicated by H', is almost equal to the height H if the thickness of film 116 is uniform (X=Y). The aspect ratio A' is therefore represented as H'/D' after the wiring protection film 116 (SiOF film) is formed.

In other words, the height H' of each metal wiring 114 after the wiring protection film 116 is formed on the surface of the metal wiring 114 is substantially equal to the height H thereof before the film 116 is formed. Therefore, the aspect ratio A' after the SiOF film is formed is greater than the aspect ratio A (A'>A) by 2Y (Y=the thickness of the film 116 formed on the side of the metal wiring 114).

There is another problem in which a high-dielectric-constant $SiO_2$ film (whose relative dielectric constant $\epsilon$ is 4.1) is formed as the wiring protection film 116 on the side walls of the metal wirings 114 and on the exposed surface of the interlayer insulation film 110 to thereby increase the capacitance between the wirings.

The above problems are not limited only to the first metal wirings 114. The same is true of the second metal wirings 122 and three or more metal wirings.

BRIEF SUMMARY OF THE INVENTION

An object of the present invention is to provide a method of manufacturing a semiconductor device capable of forming an SiOF film of low hygroscopicity between adjacent wirings by HDP-CVD satisfactorily without causing any void or damaging the wirings while preventing a wiring-to-wiring aspect ratio from increasing.

Another object of the present invention is to provide a method of manufacturing a semiconductor device capable of forming an SiOF film of low hygroscopicity between adjacent wirings by HDP-CVD while preventing the capacitance between the wirings from increasing.

To attain the above objects, according to one aspect of the present invention, there is provided a method of manufacturing a semiconductor device including a semiconductor element formed on a semiconductor substrate, the method comprising the steps of:

forming a plurality of metal wirings on an insulation film provided on a top surface of the semiconductor substrate;

forming a silicon oxide film at least on top surfaces of the metal wirings by plasma chemical vapor deposition under condition that an in-chamber pressure is 5 mTorr or lower, the silicon oxide film being used as a wiring protection film; and forming an interlayer insulation film by high-density plasma chemical vapor deposition so as to coat the wiring protection film and fill a space between the metal wirings, the interlayer insulation film being constituted of a fluorine-added silicon oxide film.

According to another aspect of the present invention, there is provided a method of manufacturing a semiconductor device including a semiconductor element formed on a semiconductor substrate, the method comprising the steps of:

forming a plurality of metal wirings on an insulation film provided on a top surface of the semiconductor substrate;

forming a silicon oxide film, which serves as a wiring protection film, by plasma chemical vapor deposition so as to coat the metal wirings, the silicon oxide film being formed under conditions that an in-chamber pressure is 5 mTorr or lower and radio frequency power of 500 W or lower is applied to the semiconductor substrate, and a thickness of the silicon oxide film formed on side walls of the metal wirings and a surface of the insulation film being less than a thickness of the silicon oxide film formed on top surfaces of the metal wirings; and forming an interlayer insulation film by high-density plasma chemical vapor deposition so as to coat the wiring protection film and fill a space between the metal wirings, the interlayer insulation film being constituted of a fluorine-added silicon oxide film.

According to the foregoing method of manufacturing a semiconductor device, when a fluorine-added silicon oxide film of low hygroscopicity is buried into a space between metal wirings, the thickness of a silicon oxide film formed at least on the side walls of the metal wirings can be made less than that of a silicon oxide film formed on the top surfaces thereof. Otherwise, a silicon oxide film can be formed selectively only on the top surface of each metal wiring.

The silicon oxide film, which prevents the corner portions of the metal wirings from being damaged in burying the fluorine-added silicon oxide film, is formed on the side walls of the metal wirings with the same thickness as that of the silicon oxide film formed on the top surfaces of the metal wirings. Consequently, when the fluorine-added silicon oxide film is formed, the aspect ratio can be prevented from increasing and so can be the wiring-to-wiring capacitance.

It is desirable that the thickness of the silicon oxide film formed on the side walls of the metal wirings should be not greater than 20% or less of that of the silicon oxide film formed on the top surfaces thereof. When the aspect ratio (A) exceeds 2.0 before the fluorine-added silicon oxide film is formed, if the thickness of the silicon oxide film formed on the side walls of the metal wirings is greater than 20% of that of the silicon oxide film formed on the top surfaces thereof, the aspect ratio (A') after the fluorine-added silicon oxide film is formed is undesirably increased.

Favorably, the silicon oxide film is formed on the metal wirings such that its thickness ranges from 10 nm to 100 nm. If the thickness is 10 nm or less, an effect of preventing the metal wirings from being damaged is lessened. If the thickness exceeds 100 nm, a decrease in dielectric constant of an insulation film between the metal wirings cannot be expected.

The silicon oxide film can be formed using a high-density plasma CVD system. Since the silicon oxide film and fluorine-added silicon oxide film can be formed continuously with each other by the same high-density plasma CVD system, the manufacturing steps of the semiconductor device can greatly be simplified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.
(First Embodiment)

Figure 1:
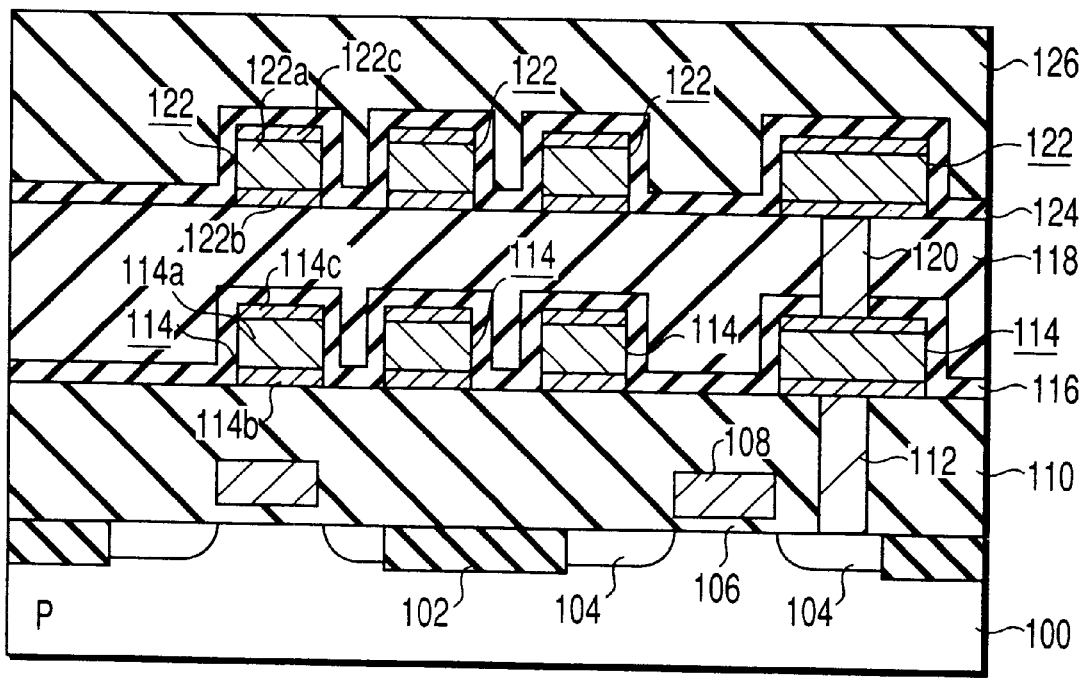
FIG. 1 is a schematic cross-sectional view showing the constitution of a prior art semiconductor device.
Figure 2:
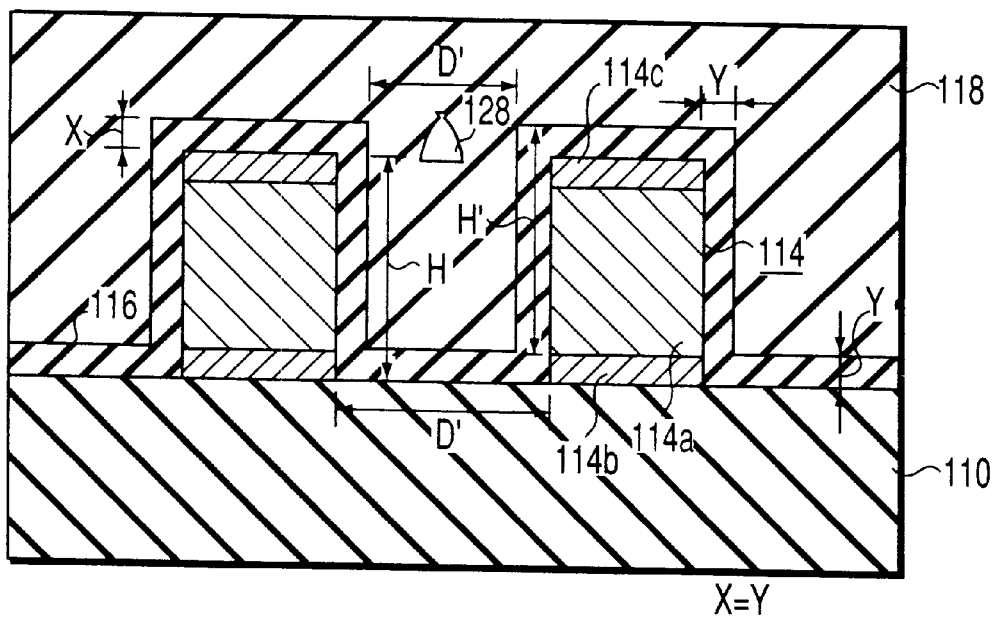
FIG. 2 is an enlarged cross-sectional view of the major part of the semiconductor device shown in FIG. 1.
Figure 3:
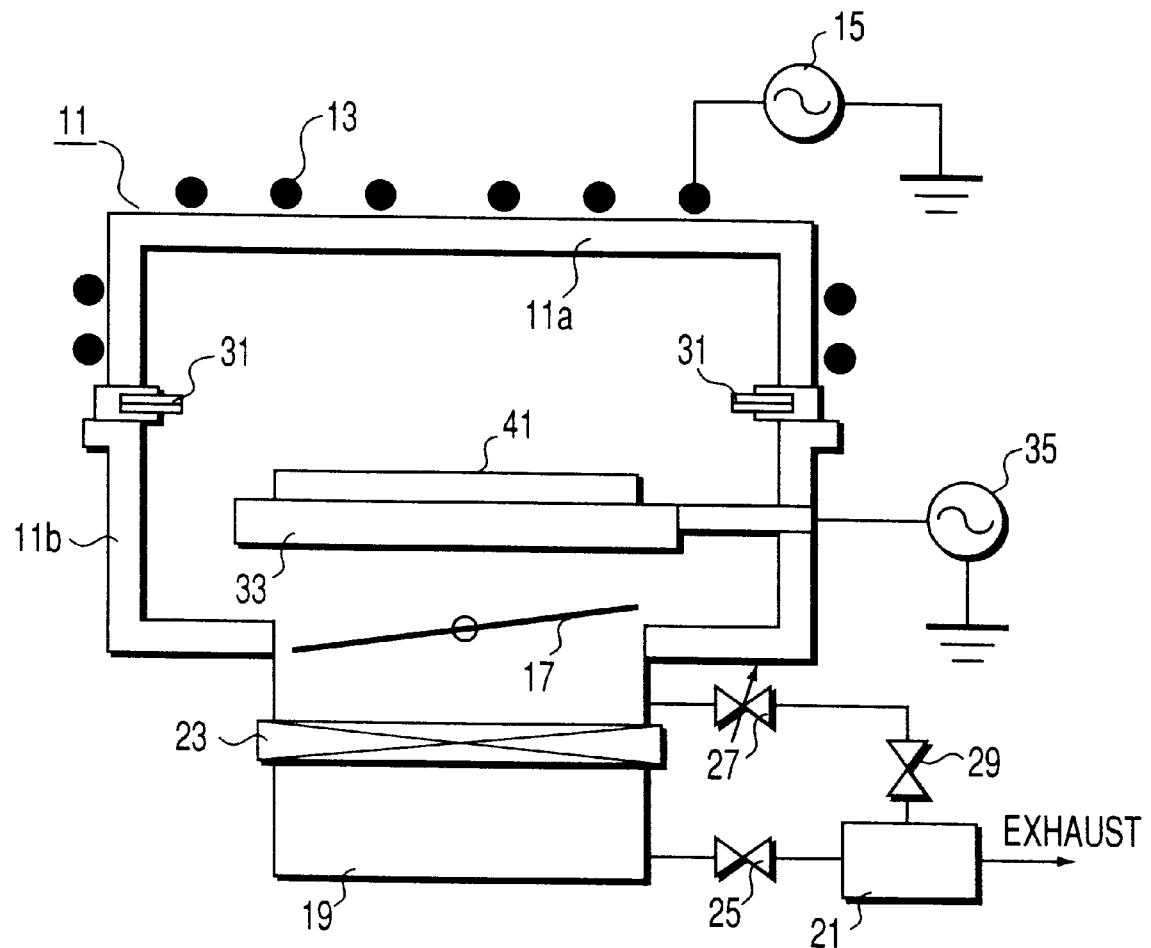
FIG. 3 is a schematic view showing the basic structure of an HDP-CVD system according to the present invention.

FIG. 3 illustrates the basic structure of an HDP-CVD system used for forming an $SiO_2$ film and an SiOF film in the present invention. In this system, an ICP coil is used as a high-density plasma source.

Referring to FIG. 3, a reaction vessel 11 is constituted of a ceramic dome section 11a and a metal chamber section 11b. An antenna 13 is wound on the top of the ceramic dome section 11a and the sides close thereto. An RF (radio frequency) power supply 15 is connected to the antenna 13. The RF power supply 15 supplies RF power to the antenna 13 to generate plasma inside the ceramic dome section 11a by inductive coupling.

The internal pressure of the metal chamber section 11b is controlled by a throttle valve 17. A turbo-molecular pump 19 and a dry pump 21 are connected to the metal chamber section 11b. A vacuum can be produced in the reaction vessel 11 by the pumps 19 and 21.

A gate valve 23 is provided between the turbo-molecular pump 19 and metal chamber section 11b, and an isolation valve 25 is interposed between the pump 19 and dry pump 21. Moreover, a throttle valve 27 and an isolation valve 29 are arranged between the metal chamber section 11b and dry pump 21.

A plurality of nozzles 31 are provided on the sides of the ceramic dome section 11a so as to introduce $SiH_4$ gas, $O_2$ gas, $SiF_4$ gas and Ar gas into the reaction vessel 11.

The reaction vessel 11 includes a substrate ground electrode 33. This electrode 33 is of an electrostatic chuck type and capable of holding a semiconductor substrate 41 as a silicon wafer by adsorption. The electrode 33 is also capable of introducing He gas for cooling the semiconductor substrate 41. An RF power supply 35 is connected to the substrate ground electrode 33 to apply a self-bias thereto.

An example of a semiconductor device to be manufactured using the foregoing HDP-CVD system will now be described.

Figure 4:
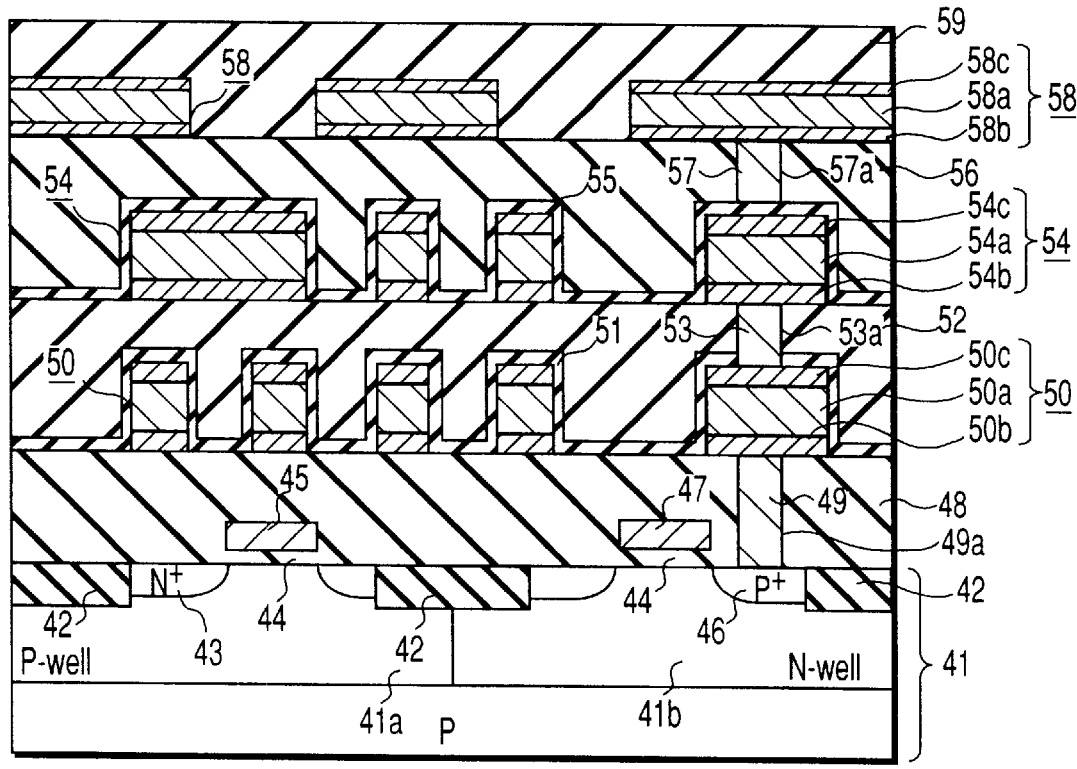
FIG. 4 is a schematic cross-sectional view of a semiconductor device according to a first embodiment of the present invention.
Figure 5:
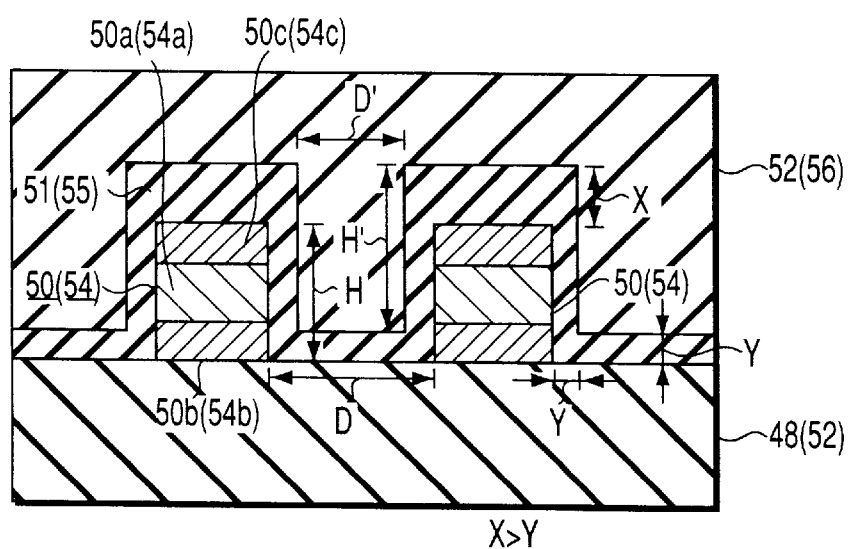
FIG. 5 is an enlarged cross-sectional view of the major part of the semiconductor device shown in FIG. 4.

FIG. 4 schematically shows the constitution of a semiconductor device according to a first embodiment of the present invention. FIG. 5 is an enlarged view of the major part of the device shown in FIG. 4. In the first embodiment, a wiring protection film of an $SiO_2$ film is formed around metal wirings formed on a semiconductor substrate, and an interlayer insulation film of low dielectric constant such as an SiOF film is buried into a space between adjacent metal wirings.

Referring to FIG. 4, a P-well 41a and an N-well 41b are formed in a P-type silicon semiconductor substrate 41. Element isolation regions (STI) 42 are formed selectively in a major surface area of the substrate 41.

An NMOS transistor is formed in an element region of the P-well 41a delimited by the regions 42, and a PMOS transistor is formed in an element region of the N-well 41b delimited by the regions 42.

The NMOS transistor is constituted of source and drain regions ($N^+$) 43 and 43 formed in the surface area of the P-well 41a, a gate oxide film 44 formed therein, and a gate electrode 45 formed on the gate oxide film 44 and between the source and drain regions 43 and 43.

The PMOS transistor is constituted of source and drain regions ($P^+$) 46 and 46 formed in the surface area of the N-well 41b, a gate oxide film 44 formed therein, and a gate electrode 47 formed on the film 44 and between the source and drain regions 46 and 46.

An interlayer insulation film 48 of a BPSG film is formed on the semiconductor substrate 41 so as to coat the respective transistors. The film 48 includes a contact plug 49 which contacts one of the source and drain regions 46 and 46 of the PMOS transistor. The contact plug 49 is formed of a contact hole 49a which is filled with tungsten.

The surface of the interlayer insulation film 48 is flattened by CMP, and a plurality of first metal wirings 50 each having a given pattern are formed thereon. Each of the first metal wirings 50 is constituted of an aluminum (Al) film 50a, and barrier metal layers 50b and 50c of Ti/TiN between which the film 50a is interposed. The first metal wirings 50 each have a thickness of about 500 nm. One of the first metal wirings 50 is electrically connected to one of the source and drain regions 46 and 46 of the PMOS transistor through the contact plug 49.

The (exposed) surface of the interlayer insulation film 48, including the first metal wirings 50, is covered with a wiring protection film 51 of an $SiO_2$ film (see FIG. 5). The thickness X of part of the film 51 which is deposited on the top of each of the first metal wirings 50 is set to 50 nm (appropriately 10 nm to 100 nm). The thickness Y of the other part of the film 51 (which is formed on the side walls of each of the wirings 50 and on the exposed surface of the film 48) is less than thickness X and set to not more than 10 nm. The wiring protection film 51 having such a difference in thickness can be formed by controlling its forming conditions using the HDP-CVD system shown in FIG. 3. The details will be described later.

A low-dielectric-constant interlayer insulation film 52 of an SiOF film is formed so as to coat the wiring protection film 51. The film 52 includes a contact plug 53 which passes through the film 51 and contacts one of the first metal wirings 50. The contact plug 53 is constituted of a contact hole 53a which is filled with tungsten.

The surface of the interlayer insulation film 52 is flattened by CMP, and a plurality of second metal wirings 54 each having a given pattern are formed thereon. Like the foregoing first metal wirings 50, the second metal wirings 54 are each constituted of an aluminum (Al) film 54a and barrier metal layers 54b and 54c of Ti/TiN between which the film 54a is interposed. Each of the second metal wirings 54 has a thickness of about 500 nm. One of the second metal wirings 54 is electrically connected to one of the first metal wirings 50 through the contact plug 53.

The (exposed) surface of the interlayer insulation film 52, including the second metal wirings 54, is covered with a wiring protection film 55 (see FIG. 5). Like the above wiring protection film 51, the film 55 is constituted of an $SiO_2$ film. The thickness X of part of the film 55 which is deposited on the top of each of the second metal wirings 54 is set to 50 nm (appropriately 10 nm to 100 nm). The thickness Y of the other part of the film 55 (which is formed on the side walls of each of the wirings 54 and on the exposed surface of the film 52) is less than thickness X and set to not more than 10 nm. The wiring protection film 55 having such a difference in thickness can be formed by controlling its forming conditions using the HDP-CVD system shown in FIG. 3. The details will be described later.

A low-dielectric-constant interlayer insulation film 56 of an SiOF film is formed so as to coat the wiring protection film 55. The film 56 includes a contact plug 57 which passes through the film 55 and contacts one of the second metal wirings 54. The contact plug 57 is constituted of a contact hole 57a which is filled with tungsten.

The surface of the interlayer insulation film 56 is flattened by CMP, and a plurality of third metal wirings 58 each having a predetermined pattern are formed thereon. Like the foregoing first and second metal wirings 50 and 54, the third metal wirings 54 are each constituted of an aluminum (Al) film 58a and barrier metal layers 58b and 58c of Ti/TiN between which the film 58a is interposed. One of the third metal wirings 58 is electrically connected to one of the second metal wirings 54 through the contact plug 57.

A protecting insulation film 59 of CVD-$SiO_2$ or CVD-$S_3N_4$ is formed so as to coat the third metal wirings 58.

In the first embodiment described above, the metal wirings are stacked in three layers; however, they can be done in four or five layers.

A method of forming the above-described wiring protection films 51 and 55 using the HDP-CVD system shown in FIG. 3, will now be described.

To form the films 51 and 55, the semiconductor substrate 41 is put into the metal chamber section 11b of the reaction vessel 11 and then fixed onto the substrate ground electrode 33 by the electrostatic chuck. $SiH_4$ gas of 50 sccm, $O_2$ gas of 150 sccm, and Ar gas of 50 sccm are introduced from the nozzles 31 into the reaction vessel 11. Further, RF power of about 3000 W is supplied from the RF power supply 15 to the antenna 13 to excite plasma in the ceramic dome section 11a.

While the RF power supplied to the substrate ground electrode 33 is being controlled in this condition, an $SiO_2$ film is deposited on the semiconductor substrate 41 to form the wiring protection films 51 and 55 as shown in FIG. 4.

Figure 6:
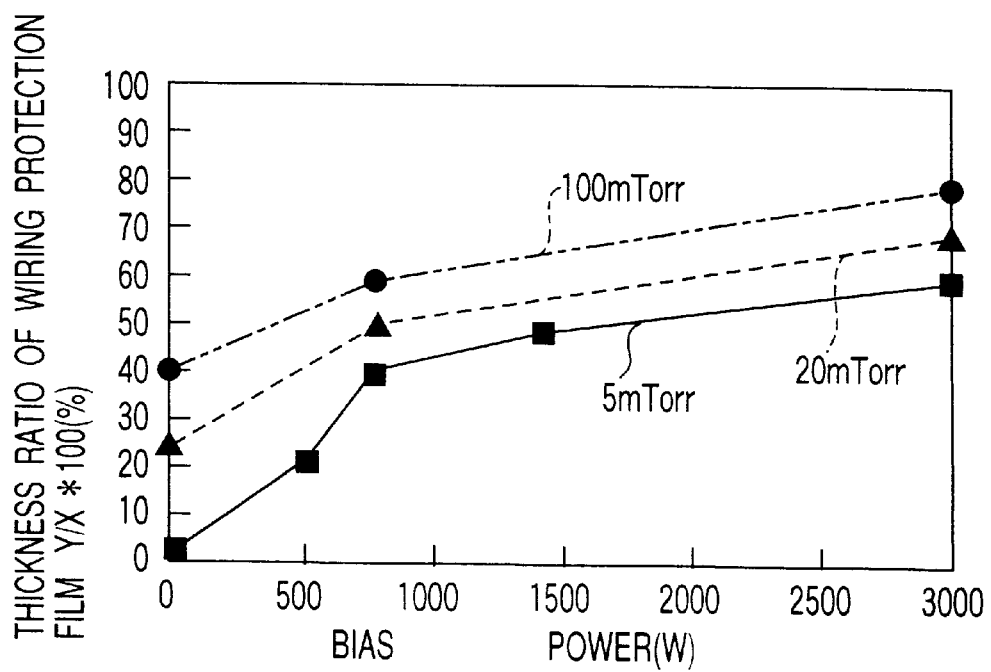
FIG. 6 is a graph showing a relationship between the bias power and the thickness ratio of a wiring protection film with respect to in-chamber pressure.

FIG. 6 is a graph showing a relationship between the bias power and the thickness ratio (Y/X*100) of thickness Y (of the wiring protection film formed on the side walls of the metal wiring and exposed surface of the interlayer insulation film) to thickness X (thereof formed on the top surface of the metal wiring) with respect to the in-chamber pressure of the reaction vessel.

As is apparent from FIG. 6, the lower limit of the thickness ratio (Y/X*100) decreases as the in-chamber pressure lowers, such as 100 mTorr (0.1 Torr), 20 mTorr and 5 mTorr. The thickness ratio also decreases as the bias power becomes small.

In the HDP-CVD system, when the in-chamber pressure in the reaction vessel 11 is set to 5 mTorr or lower and the plasma condition is maintained, RF power (bias power) of 500 W or less is applied from the RF power supply 35 to the substrate ground electrode 33. Thus, the different gases introduced into the reaction vessel 11 are split by plasma to thereby form the wiring protection films 51 and 55 in which the thickness Y is not greater than 20% of the thickness X. If the thickness X is about 50 nm, the thickness Y is 10 nm or less.

After the wiring protection films 51 and 55 are formed, the underside of the semiconductor substrate 41 is cooled by He gas, and RF power of about 1500 W is supplied from the RF power supply 35 to the substrate ground electrode 33. $SiF_4$ gas of 100 sccm, $O_2$ gas of 100 sccm, Ar gas of 100 sccm, and $SiH_4$ gas of 10 sccm are introduced from the nozzles 31 into the reaction vessel 11. The in-chamber pressure in the reaction vessel 11 is set to 5 mTorr, and RF power of about 3000 W is supplied from the RF power supply 15 to the antenna 13 to excite plasma in the ceramic dome section 11a.

By the foregoing process, the SiOF film is formed on the semiconductor substrate 41 at a speed of about 400 nm per minute, and the low-dielectric-constant interlayer insulation films 52 and 56 are formed as illustrated in FIG. 4.

Next, a relationship between the ratio (Y/X*100) of the thickness Y to the thickness X and the aspect ratio A' after the wiring protection film is formed, will be described with reference to FIG. 7. The height H of the metal wiring 50 (54) is set to 0.5 μm (500 nm) before the wiring protection film 51 (55) is formed, and the thickness X of the film 51 (55) formed on the top of the metal wiring 50 (54) is set to 50 nm (see FIG. 5).

Figure 7:
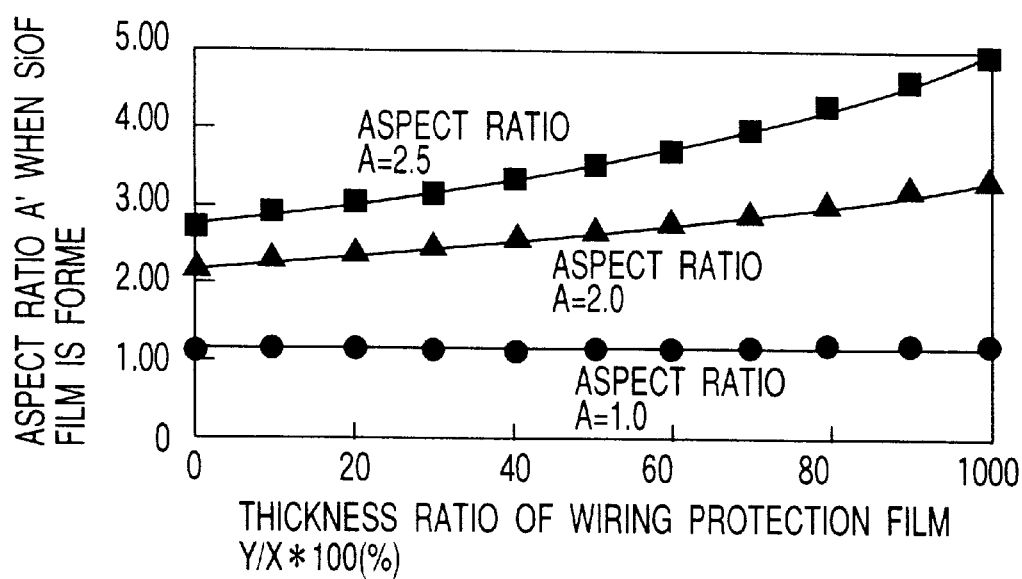
FIG. 7 is a graph showing a relationship between the thickness ratio of a wiring protection film and the aspect ratio after an SiOF film is formed.

As is apparent from FIG. 7, when the thickness Y is great and the thickness ratio (Y/X*100) is close to 100%, the aspect ratio A' after the SiOF film is formed is increased in relation to the aspect ratio A before it is formed.

In contrast, the less the thickness Y, the more the aspect ration A' can be prevented from increasing. Consequently, the SiOF film can be deposited between wirings without causing any void. This tendency becomes more remarkable as an interval between wirings decreases.

Since, moreover, the $SiO_2$ film (having a relative dielectric constant ε of 4.1) formed as the wiring protection film 51 (55) between wirings can be decreased in volume, the wiring capacitance can be prevented from increasing.

(Second Embodiment)

Figure 8:
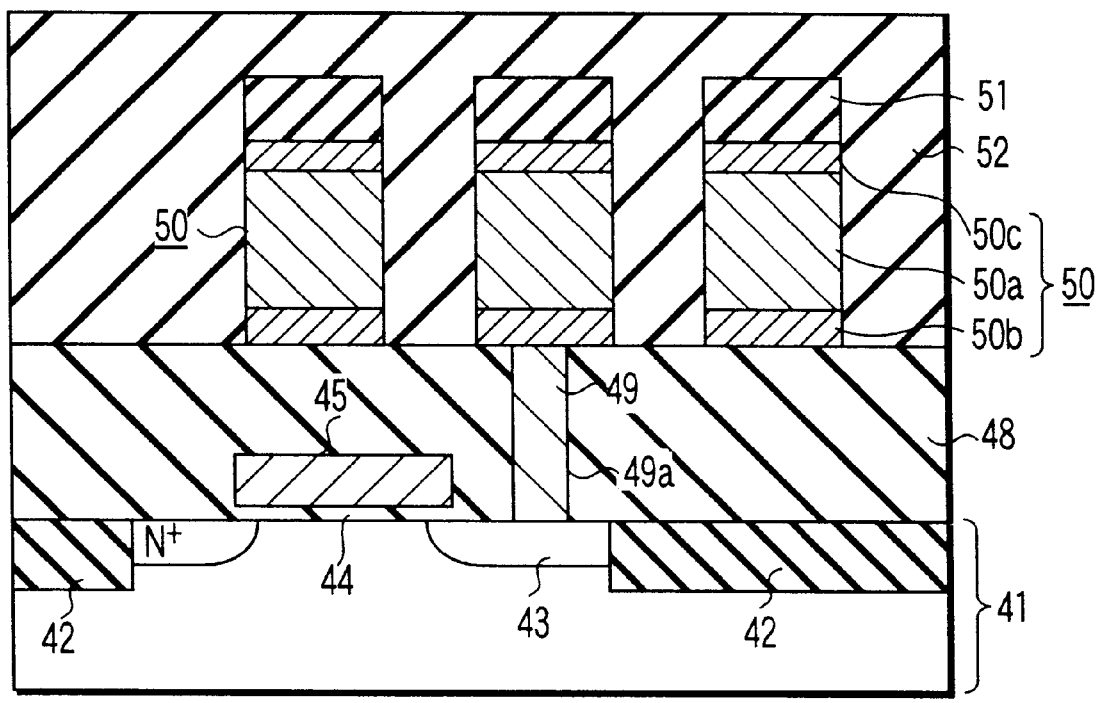
FIG. 8 is an enlarged cross-sectional view of the major part of a semiconductor device according to a second embodiment of the present invention.

FIG. 8 is an enlarged view of the major part of a semiconductor device according to a second embodiment of the present invention. In the second embodiment, a wiring protection film of an $SiO_2$ film is formed on only the top of each of metal wirings formed on the semiconductor substrate, and a low-dielectric-constant interlayer insulation film such as an SiOF film is buried into a space between the metal wirings.

Element isolation regions (STI) 42 are formed selectively in a major surface area of a P-type silicon semiconductor substrate 41. An NMOS transistor is formed in an element region of the substrate 41 which is delimited by the element isolation regions 42. The NMOS transistor is constituted of source and drain regions ($N^+$) 43 and 43 formed in a surface area of the substrate 41, a gate oxide film 44 formed therein, and a gate electrode 45 formed on the gate oxide film 44 and between the source and drain regions 43 and 43.

An interlayer insulation film 48 of a BPSG film is formed on the semiconductor substrate 41 so as to cover the above NMOS transistor. The film 48 includes a contact plug 49 connected to one of the source and drain regions 43 and 43 of the NMOS transistor. The contact plug 49 is constituted of a contact hole 49a filled with tungsten.

The surface of the interlayer insulation film 48 is flattened by CMP, and a plurality of first metal wirings 50 each having a given pattern are formed thereon. The first metal wirings 50 are each constituted of an aluminum (Al) film 50a and barrier metal layers 50b and 50c of Ti/TiN between which the film 50a is interposed. Each of the first metal wirings 50 has a thickness of about 500 nm. One of the first metal wirings 50 is electrically connected to one of the source and drain regions 43 and 43 through the contact plug 49.

The top surface of each first metal wiring 50 is covered with a wiring protection film 51 of an SiO₂ film (The film 51 is hardly deposited on the side walls of the wiring 50 and the exposed surface of the interlayer insulation film 48). The thickness X of part of the film 51 which is deposited on the top of the first metal wiring 50 is set to 50 nm (appropriately 10 nm to 100 nm).

A low-dielectric-constant interlayer insulation film 52 such as an SiOF film is formed so as to coat the wiring protection film 51 and the exposed surface of the interlayer insulation film 48.

When the need arises, the metal wirings can be stacked in two, three or more layers on the interlayer insulation film 52, and a protecting insulation film (not shown) of CVD-SiO₂ or CVD-S₃N₄ can be formed so as to coat the uppermost metal wiring.

In the second embodiment, the wiring protection film 51 can be formed by controlling its forming conditions using the HDP-CVD system illustrated in FIG. 3. When the in-chamber pressure in the reaction vessel 11 is 5 mTorr or lower and the plasma condition is maintained, the RF power (bias power) applied from the RF power supply 35 to the substrate ground electrode 33 is set to 0. Since no RF power is supplied into the metal chamber section 11b, the SiO₂ film is deposited to the thickness of about 50 nm on the metal wiring 50 and substantially not on the side walls of the wiring 50 or the exposed surface of the interlayer insulation film 48 (see FIG. 6).

If the wiring protection film 51 is formed only on the metal wiring 50 such that the thickness ratio (Y/X*100) becomes 0%, the wiring-to-wiring distance D' is substantially equal to the wiring-to-wiring distance D. The aspect ratio A' after the SiOF film is formed is therefore increased in accordance with the height H' of the metal wiring and, in this case, a difference between the height H' and the height H (H'–H) corresponds to the thickness X of the wiring protection film 51 and thus its influence is small. The aspect ratio A' is hardly increased in relation to the wiring aspect ratio A. The SiOF film can thus be deposited sufficiently between wirings without causing any void. This tendency becomes more remarkable as an interval between the wirings decreases.

Since, moreover, the SiO₂ film (having a relative dielectric constant ε of 4.1) formed between wirings can be decreased in volume, the wiring capacitance can be prevented from increasing.

The present invention is not limited to the SiOF film as the low-dielectric-constant interlayer insulation films 52 and 56. It can be replaced with a fluorine-added nitrified silicon oxide (SiONF) film.

Needless to say, various changes and modifications can be made without departing from the scope of the subject matter of the present invention.

As described above in detail, according to the present invention, when an SiOF film of low hygroscopicity is formed by HDP-CVD, it can be buried satisfactorily in a space between metal wirings without damaging the wirings or causing any void. Further, the capacitance between the wirings can be prevented from increasing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device including a semiconductor element formed on a semiconductor substrate, the method comprising the steps of:

forming a plurality of metal wirings on an insulation film provided on a top surface of the semiconductor substrate;

forming a silicon oxide film, which serves as a wiring protection film, by high density plasma chemical vapor deposition so as to coat the metal wirings, the silicon oxide film being formed under conditions that an in-chamber pressure is 5 mTorr or lower and radio frequency power of 500 W or lower is applied to the semiconductor substrate, and a thickness of the silicon oxide film formed on side walls of the metal wirings and a surface of the insulation film being less than a thickness of the silicon oxide film formed on top surfaces of the metal wirings; and forming an interlayer insulation film by high density plasma chemical vapor deposition so as to coat the wiring protection film and fill a space between the metal wirings, the interlayer insulation film being constituted of a fluorine-added silicon oxide film.

2. A method according to claim 1, wherein the thickness of the silicon oxide film formed on the side walls of the metal wirings and the surface of the insulation film is not greater than 20% of the thickness of the silicon oxide film formed on the top surfaces of the metal wirings.

3. A method according to claim 1, wherein the silicon oxide film is formed by high density plasma chemical vapor deposition whose plasma density is $10^{10}/cm^3$ or higher.

4. A method according to claim 1, wherein the silicon oxide film and the fluorine-added silicon oxide film are deposited continuously with each other in a single chamber.

5. A method according to claim 1, wherein the interlayer insulation film becomes the insulation film for a next layer of metal wirings corresponds to the interlayer insulation film.

* * * * *